United States Patent [19]

Prall

[11] Patent Number: 5,424,569

[45] Date of Patent: Jun. 13, 1995

[54] ARRAY OF NON-VOLATILE SONOS MEMORY CELLS

[75] Inventor: Kirk Prall, Boise, Id.

[73] Assignee: Micron Technology, Inc., Boise, Id.

[21] Appl. No.: 315,977

[22] Filed: Sep. 30, 1994

Related U.S. Application Data

[62] Division of Ser. No. 238,474, May 5, 1994, Pat. No. 5,387,534.

[51] Int. Cl.[6] .................... H01L 29/06; H01L 29/68
[52] U.S. Cl. ..................... 257/324; 257/368; 257/401; 257/408; 257/622
[58] Field of Search .......... 257/324, 368, 398, 399, 257/400, 401, 408, 519, 622, 653

[56] References Cited

U.S. PATENT DOCUMENTS

| 4,714,050 | 4/1990 | Shibala | 437/203 |
| 4,975,384 | 12/1990 | Boylee | 437/52 |
| 5,234,856 | 8/1993 | Gonzalez | 437/203 |
| 5,278,438 | 1/1994 | Kim et al. | 257/316 |

OTHER PUBLICATIONS

Kazerounian, R. et al.; *Alternate Metal Virtual Ground Eprom Array Implemented In a 0.8 um Process For Very High Denisty Applications*, IEDM 91-311, pp. 11.5.1–11.5.4 (1991).

Nozaki et al.; *A 1-Mb EEPROM with MONOS Memory Cell for Semiconductor Disk Application*, IEEE Jnl. of Solid State Circuits, vol. 26, No. 4, pp. 497-501, (Apr. 1991).

Chang, Joseph; *Nonvolatile Semiconductor Memory Devices*, IEEE, vol. 64, No. 7, pp. 1039-1059, (Jul., 1976).

*Primary Examiner*—Mark V. Prenty
*Attorney, Agent, or Firm*—Wells, St. John, Roberts, Gregory & Matkin

[57] ABSTRACT

An array of SONOS memory cells includes: a) a pair of spaced, adjacent SONOS gates atop a silicon substrate within an array area; b) a trench between the gates, the trench having opposing downwardly elongated sidewalls and a base, the sidewalls being doped with a conductivity enhancing impurity of a first conductivity type to define separated source/drain diffusion regions in between and adjacent the respective gates of the pair, the trench being filled with an effectively electrically insulating material; c) a word line commonly interconnecting the adjacent SONOS gates of the pair; and d) separate bit lines separately electrically engaging the separated diffusion regions of the pair. LDD regions are also included. A method of producing such a construction is disclosed.

5 Claims, 6 Drawing Sheets

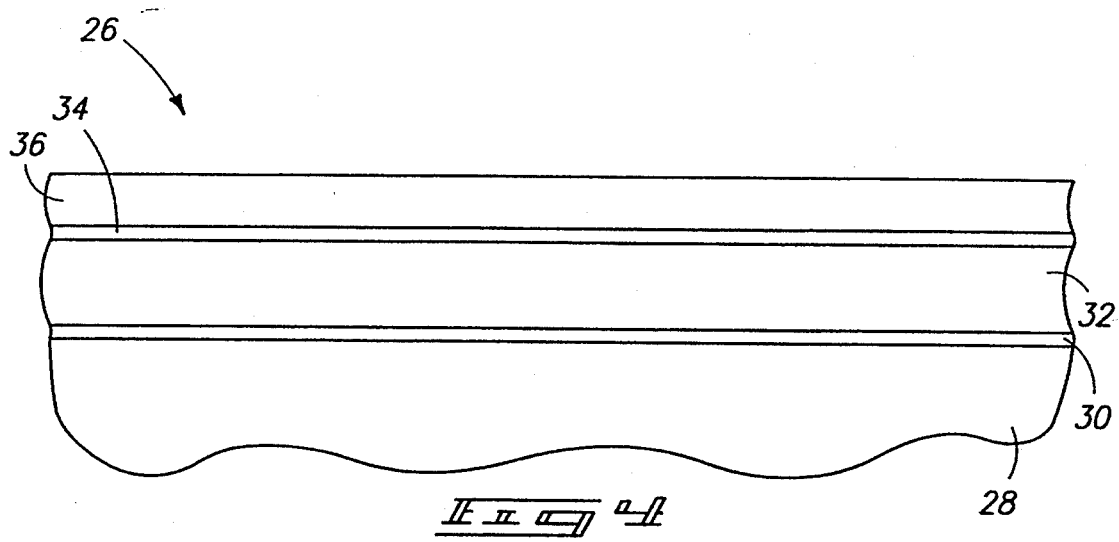
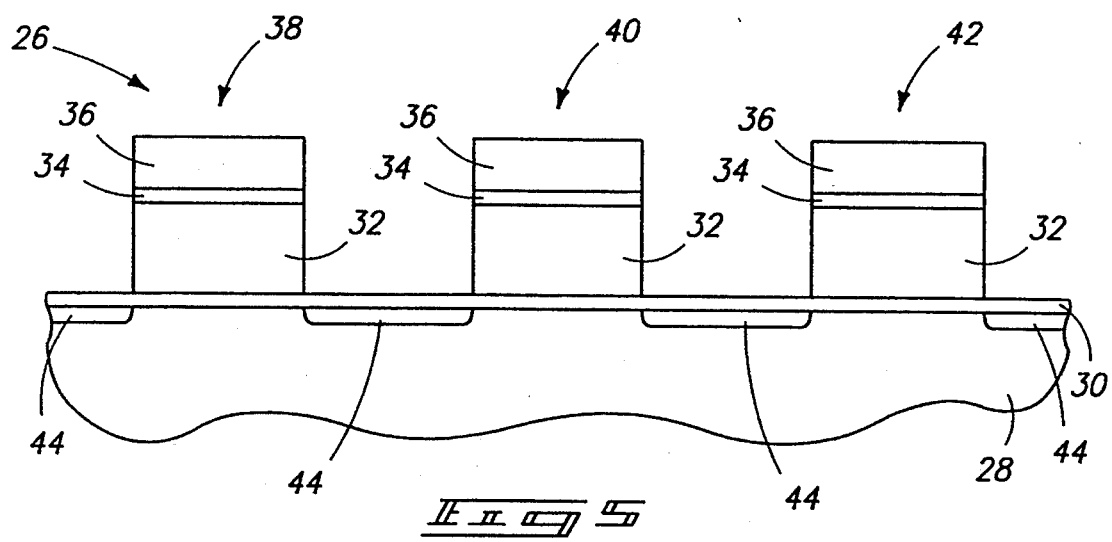
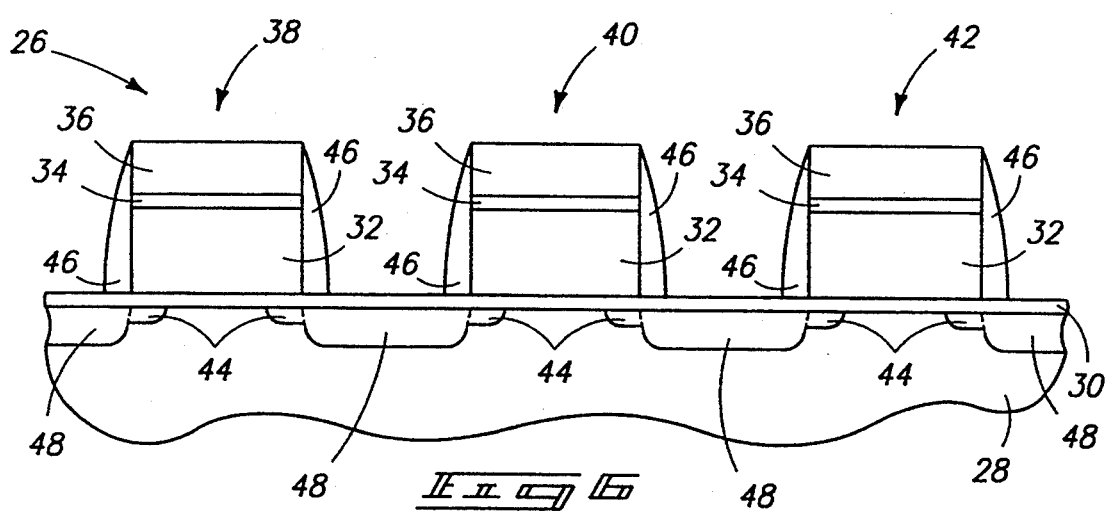

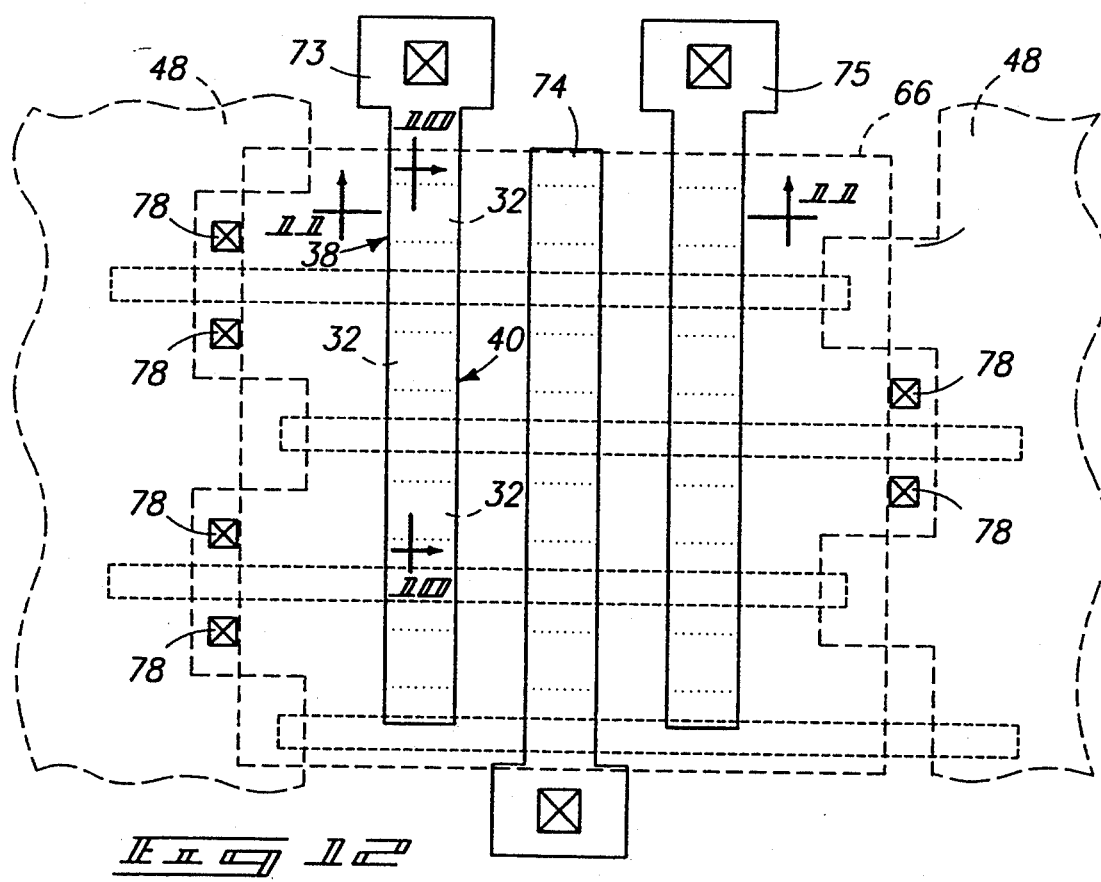
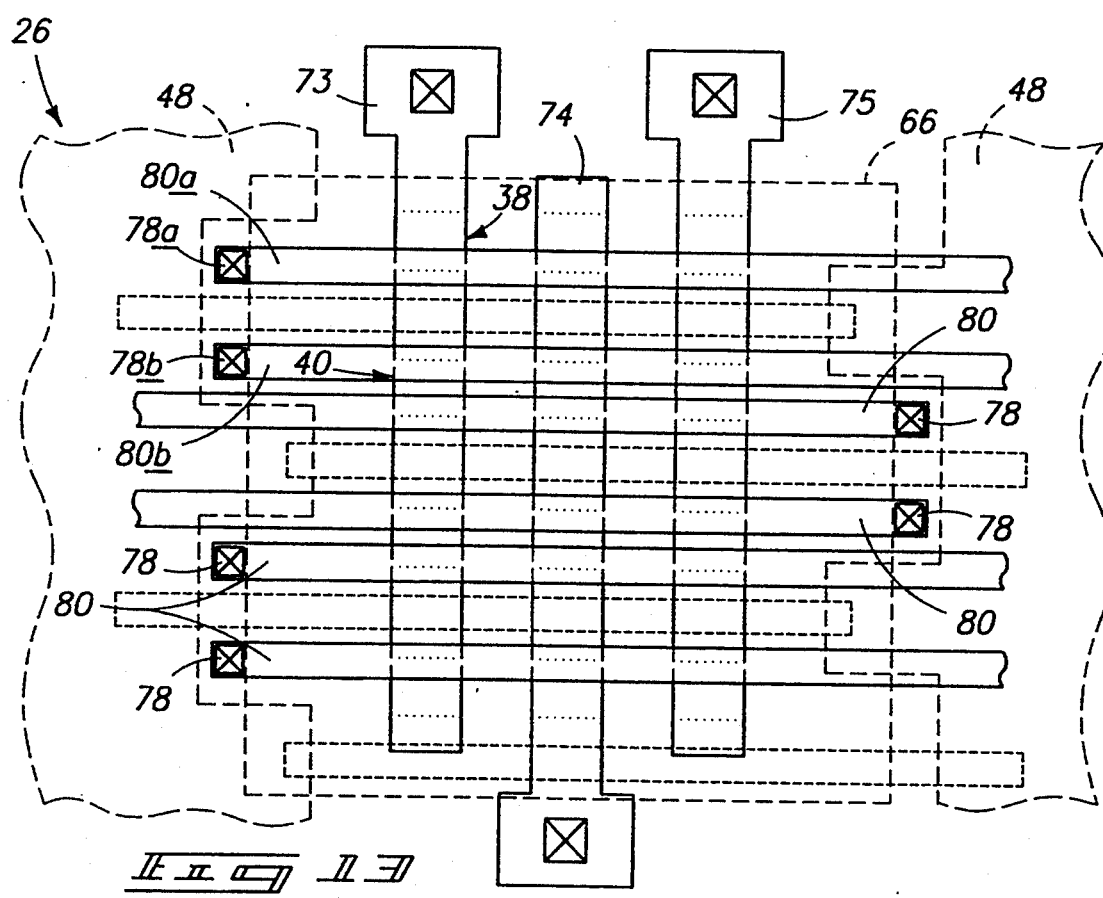

| FUNCTION | | $D_s$ | $G_s$ | $S_s$ | $V_{b/w}$ | $D_u$ | $G_u$ |
|---|---|---|---|---|---|---|---|
| SECTOR ERASE | A) | 0 | ~-8-10 | 0 | 0 | 0 | 0 |
|  | B) | +5 | -5 | +5 | +5 | +5 | -5 |
| PGM | A) | 0 | +8-10 | 0 | 0 | 5 | 5 |
|  | B) | -5 | 5 | -5 | -5 | 0 | 0 |
| SENSE | | 1V | 3V | 0 | 0/-5 | 0/oc | -5 |

ARRAY OF NON-VOLATILE SONOS MEMORY CELLS

RELATED PATENT DATA

This patent resulted from a divisional application of U.S. application Ser. No. 08/238,474, filed May 5, 1994, which issued as U.S. Pat. No. 5,387,534 on Feb. 7, 1995.

TECHNICAL FIELD

This invention relates to SONOS memory cell arrays, and to methods of forming such arrays.

BACKGROUND OF THE INVENTION

Typical semiconductor memory utilized during microprocessor operation is volatile. That is in the case of power interruption, the data stored in the semiconductor memory is typically completely lost. One way to circumvent this problem is to provide separate backup of the memory, such as battery power or capacitor storage. An alternate technique would be to make the memory fundamentally non-volatile. This option is highly desirable because non-volatile semiconductor memories would not only withstand power interruption, but also would be stored or shipped without being energized.

Typical prior art non-volatile memory cells are charge-trapping devices. Examples includes floating-gate memory devices wherein charge is stored in an isolated conductor, commonly referred to as a "floating-gate", in a field effective transistor (FET) device. Other charge-storage devices are constructed to store charge in insulator bulk traps in FET constructions. Examples includes metal-nitride-oxide-semiconductor (MNOS); metal-alumina-oxide-semiconductor (MAOS); metal-alumina-semiconductor (MAS); and silicon-oxide-nitride-oxide-semiconductor (SONOS) memory cells. This invention is specific to SONOS memory technology.

SONOS technology has existed since the late 1960's, but has not been widely used because of other apparent fundamental problems, such as data retention, process control issues, etc. Drawbacks of non-volatile semiconductor memories, such as SONOS cells, includes process complexity and cell size in comparison with a more conventional volatile dynamic random access memory (DRAM) type memory cell. Virtual ground architecture has been used in SONOS memories to reduce cell size to near theoretical limits. The use of SONOS with virtual ground has, however, been limited by the technological problems described above and by charge-disturb problems.

FIG. 1 shows a prior art circuit schematic for a SONOS virtual ground array of cells, while FIGS. 2 and 3 illustrate a top and sectional cut, respectively, of a portion of the FIG. 1 virtual ground SONOS array. FIG. 1 illustrates four SONOS memory cells 10, 11, 12 and 13, each consisting of a single SONOS memory transistor. Looking specifically to transistor 10, such is comprised of a bulk substrate portion 14 and includes a pair of source/drain diffusion regions 15, 16, a gate dielectric layer 17 and a polysilicon gate 18. Substrate 14 would be of a semiconductor material, typically comprising silicon, while dielectric region 17 would be formed of an oxide-nitride-oxide (ONO) construction. Thus, in combination with the polysilicon of gate 18, a silicon-oxide-nitride-oxide-semiconductor (SONOS) transistor is provided. Field oxide regions 19 and 20 and adjacent insulating oxide regions 21 and 22 provide electrical isolation from adjoining devices. An overlying polysilicon word line 23 provides electrical connection to gate 18.

Many memory cells, including some non-volatile memory cells, enable sharing of source/drain diffusion regions among an adjacent pair of transistors. This enables increased circuit density. Such sharing is not, however, possible with the illustrated virtual ground SONOS cell because of the need for isolated source/drain diffusion areas between adjacent transistors. Specifically, adjacent SONOS transistors 10 and 11 require separate and electrically isolated adjacent bit lines 24 and 25.

Because of this isolated source/drain requirement, the virtual ground SONOS cell size is significantly larger when compared to other memories. Specifically referring to FIG. 3, the length direction of the cell consists of one isolation space, two diffusions, and a gate resulting in a length of four times the minimum photolithographic masking feature size, which is referred to in FIG. 3 as $\lambda$. Accordingly, the maximum length dimension of the illustrated cell is $4\lambda$, providing a cell area of $8\lambda^2$. On the other hand, a typical floating-gate non-volatile memory cell has a theoretical cell size of $4\lambda^2$, again where $\lambda$ is the minimum lithographic feature size.

Certain SONOS and MNOS memory cells have been constructed which enable sharing of source/drain diffusion regions between adjacent transistors. Such a construction does, however, require an additional transistor, referred to as a "select transistor", to prevent charge stored in the oxide-nitride-oxide from being disturbed. An example of such prior art is shown by Nozaki et al., "A 1-Mb EEPROM With MONOS Memory Cell For Semiconductor Disk Application", *IEEE Journal Of Solid-State Circuits*, Vol. 26, No. 4, pp. 497–501 (April 1991).

BRIEF DESCRIPTION OF THE DRAWINGS

Preferred embodiments of the invention are described below with reference to the following accompanying drawings.

FIG. 4 is a diagrammatic sectional view of a wafer fragment at a processing step in accordance with the invention.

FIG. 5 is a view of the FIG. 4 wafer at a processing step subsequent to that shown by FIG. 4.

FIG. 6 is a view of the FIG. 4 wafer at a processing step subsequent to that shown by FIG. 5.

FIG. 12 is a top view of the FIG. 4 wafer taken at a processing step corresponding to FIGS. 10 and 11.

FIG. 13 is a top view of the FIG. 4 wafer taken at a processing step subsequent to that shown by FIG. 12.

DETAILED DESCRIPTION OF THE PREFERRED EMBODIMENTS

Figure 1:
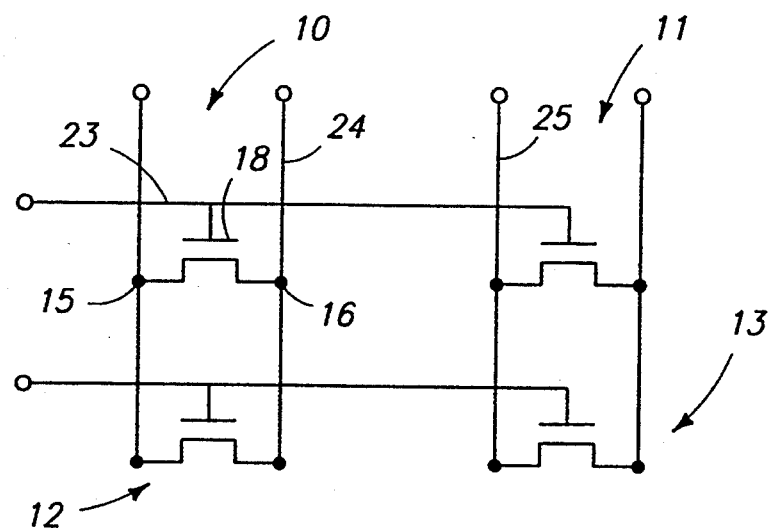
FIG. 1 is a schematic view of a prior art virtual ground SONOS memory array.
Figure 2:
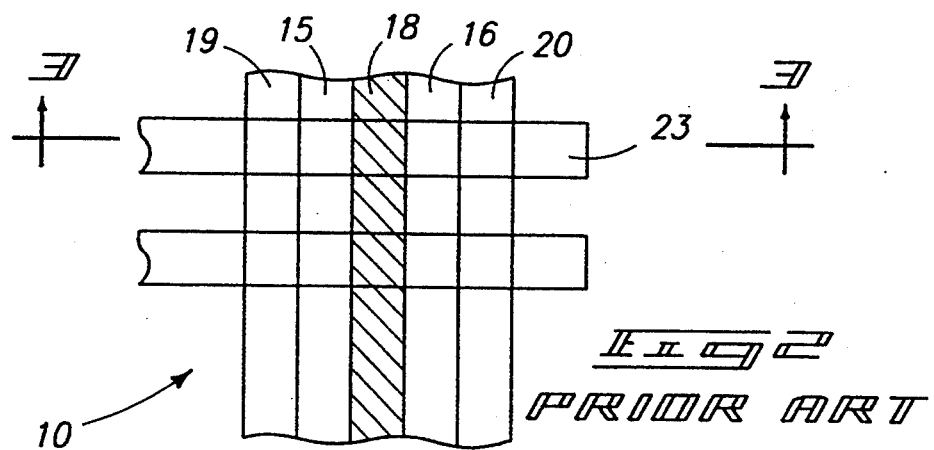
FIG. 2 is a top view of two of the SONOS transistors of the FIG. 1 array.

This disclosure of the invention is submitted in furtherance of the constitutional purposes of the U.S. Patent Laws "to promote the progress of science and useful arts" (Article 1, Section 8).

In accordance with one aspect of the invention, a method of forming an array of SONOS memory cells comprises the following steps:

providing a pair of spaced, adjacent SONOS gates atop a silicon substrate within an array area;

etching into the silicon substrate between the adjacent pair of gates to form a trench therebetween, the trench having opposing downwardly elongated sidewalls and a base;

angle doping into the opposing elongated trench sidewalls with a conductivity enhancing impurity of a first conductivity type to form separated source/drain diffusion regions in between and adjacent the respective gates of the pair;

after the angle doping, filling the trench with an effectively electrically insulating material;

depositing and patterning an electrically conductive material outwardly of and in electrical connection with the SONOS gates to form a word line commonly connecting the adjacent pair of SONOS gates;

providing respective contact openings to the separated source/drain diffusion regions; and depositing and patterning an electrically conductive material which fills the contact openings to form separate bit lines which separately engage the respective contacts of the pair.

In accordance with another aspect of the invention, an array of SONOS memory cells comprises:

a pair of spaced, adjacent SONOS gates atop a silicon substrate within an array area;

a trench between the gates, the trench having opposing downwardly elongated sidewalls and a base, the sidewalls being doped with a conductivity enhancing impurity of a first conductivity type to define separated source/drain diffusion regions in between and adjacent the respective gates of the pair, the trench being filled with an effectively electrically insulating material;

a word line commonly interconnecting the adjacent SONOS gates of the pair; and separate bit lines separately electrically engaging the separated diffusion regions of the pair.

Referring more particularly to the Figures, FIG. 4 illustrates a semiconductor wafer fragment 26 in process in accordance with the invention. Such comprises a bulk substrate region 28, which would typically constitute monocrystalline silicon. Such may or may not be lightly doped with some conductivity enhancing impurity, such as p-type, to produce a bulk substrate well. An oxide-nitride-oxide layer 30 is provided immediately adjacent bulk substrate 28. Such would preferably constitute the typical ONO construction for a SONOS cell, such as $SiO_2/Si_3N_4/SiO_2$. A polysilicon gate layer 32 is provided immediately adjacent ONO layer 30. An oxide layer 34 (e.g., $SiO_2$) and a nitride layer 36 (e.g., $Si_3N_4$) are provided outwardly of polysilicon layer 32.

Referring to FIG. 5, the various FIG. 4 illustrated layers above bulk substrate 28 are patterned to provide the series of SONOS gates 38, 40 and 42 atop silicon substrate 28. For purposes of the continuing discussion, gates 38 and 40 are considered as a pair of spaced, adjacent SONOS gates. The discussion proceeds principally with respect to processing affecting these adjacent transistors.

After gate formation, lightly-doped-drain (LDD) doping is conducted between the adjacent gates 38 and 40 with a conductivity-enhancing impurity of the first conductivity type to form diffusion regions 44 which will ultimately be utilized to form LDD regions for each of adjacent transistor gates 38 and 40. An example and preferred conductivity type for the LDD doping is n-type impurity.

Referring to FIG. 6, a layer of oxide or nitride is deposited and anisotropically etched to produce spacers 46 about gates 38 and 40. Subsequently, further doping is conducted between adjacent gates 38 and 40 with a conductivity enhancing impurity of the first conductivity type at a sufficient dose to form a source/drain region 48, which is hereinafter termed as a source/drain interconnecting region. Such a region is provided to a greater dose and depth than the doping to produce LDD diffusion region 44, as would be conventional and known by people of skill in the art. Conventional heating of the wafer will laterally drive diffusion regions 44 and 48 outwardly as shown.

Figure 7:
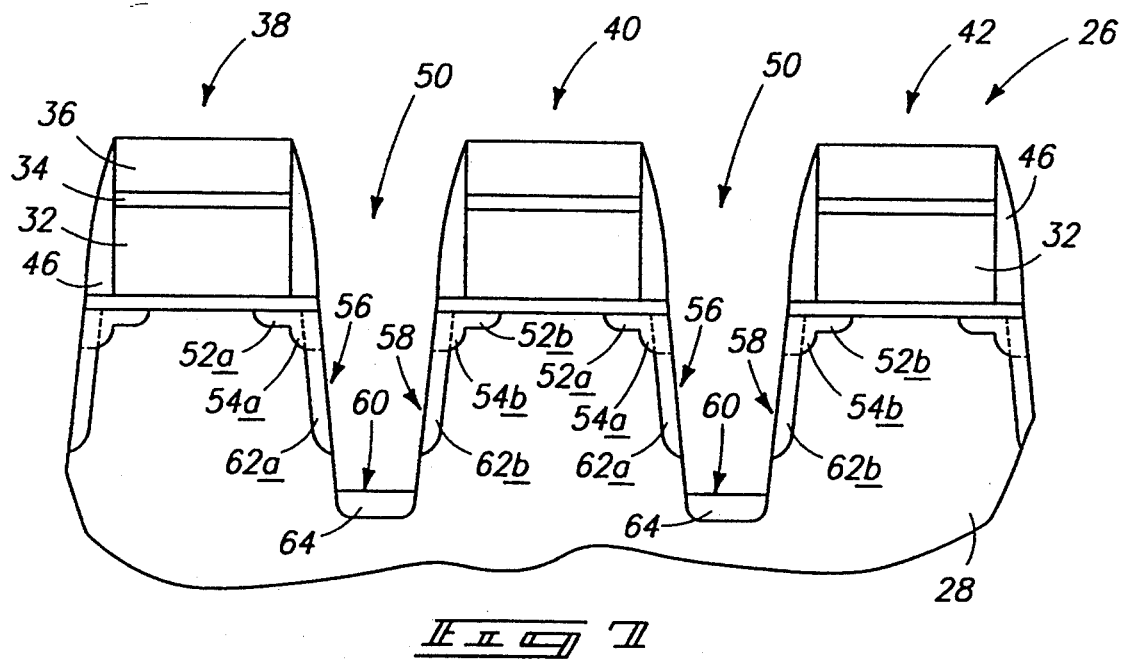
FIG. 7 is a view of the FIG. 4 wafer at a processing step subsequent to that shown by FIG. 6.

Referring to FIGS. 6 and 7, etching is conducted into silicon substrate 28 through a lateral part of LDD region 44 and a lateral part of source/drain interconnecting region 48 to form a trench 50 between adjacent SONOS gate pairs 38 and 40. Such effectively forms and isolates what was LDD regions 44 into LDD regions 52a and 52b (FIG. 7), and what was region 48 into source/drain interconnecting regions 54a and 54b. Trench 50 has opposing downwardly elongated side walls 56 and 58, and a trench base 60.

Angled doping, preferably at from 15° to 45° from vertical, is conducted into opposing elongated trench side walls 56 and 58 with a conductivity enhancing impurity of the first conductivity type to form separated source/drain diffusion regions 62a and 62b in between and adjacent pair of gates 38 and 40. A typical and preferred dose for regions 62a and 62b would be the same as that for implant 48, which produced regions 54a and 54b. Source/drain regions 62a and 62b are formed to be downwardly elongated. Regions 52 and 54 are angled away from downwardly elongated source/drain region 62 to be substantially perpendicular therefrom. Interconnecting regions 54a and 54b provide respective interconnection or extension of regions 62a and 62b, respectively, in the direction of gates 38 and 40, respectively, in the event angled doping and subsequent anneal is insufficient to place regions 62a and 62b in desired proximity to their respective gates.

Figure 3:
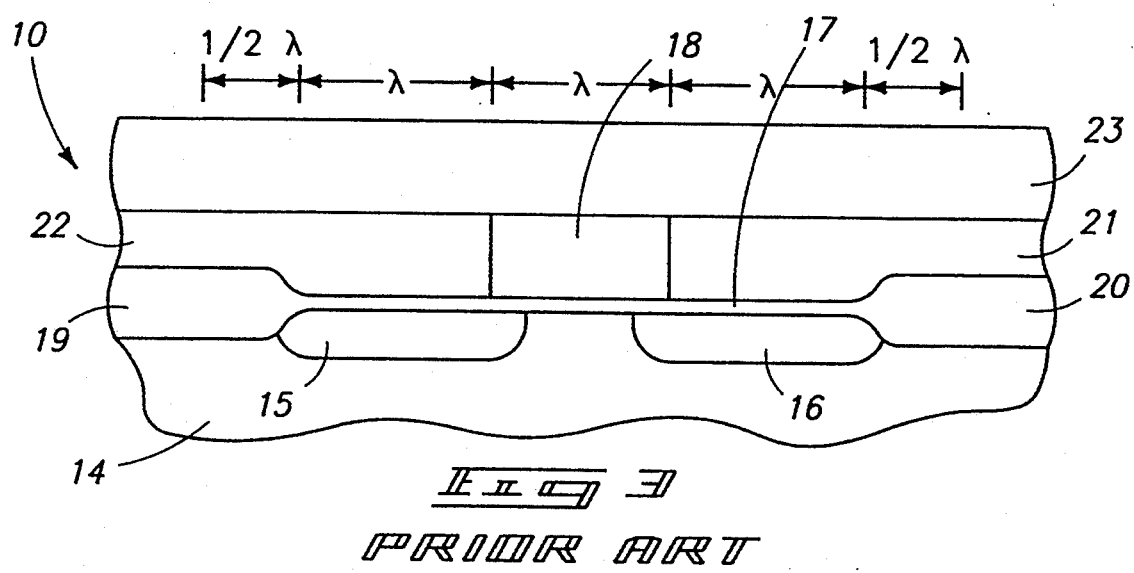
FIG. 3 is a diagrammatic sectional view of a wafer fragment containing one of the SONOS transistors of FIG. 1, as taken through line 3—3 in FIG. 2.

Thus, diffusion regions of a field effect transistor gate in a SONOS memory cell are provided along trench side walls in a manner which reduces horizontal substrate area consumed by a given SONOS transistor. Where the illustrated FIG. 3 prior art cell consumes 4λ of lateral wafer expanse for a given cell, the SONOS transistor cell of FIG. 7 consumes just 2λ of lateral wafer expanse, as do floating gate EEPROMs, due to diffusion regions of adjacent transistors being formed essentially within one region of minimum photolithographic feature size.

Zero degree doping is then conducted between gate pairs 38 and 40 into trench base 60 with a conductivity enhancing impurity of a second conductivity type to form an isolation region 64 at trench base 60. Such provides the added advantage of electrical isolation between regions 62a and 62b within bulk substrate material 28. The 0° doping could, of course, be conducted either before or after the angled doping to produce regions 62a and 62b.

Figure 8:
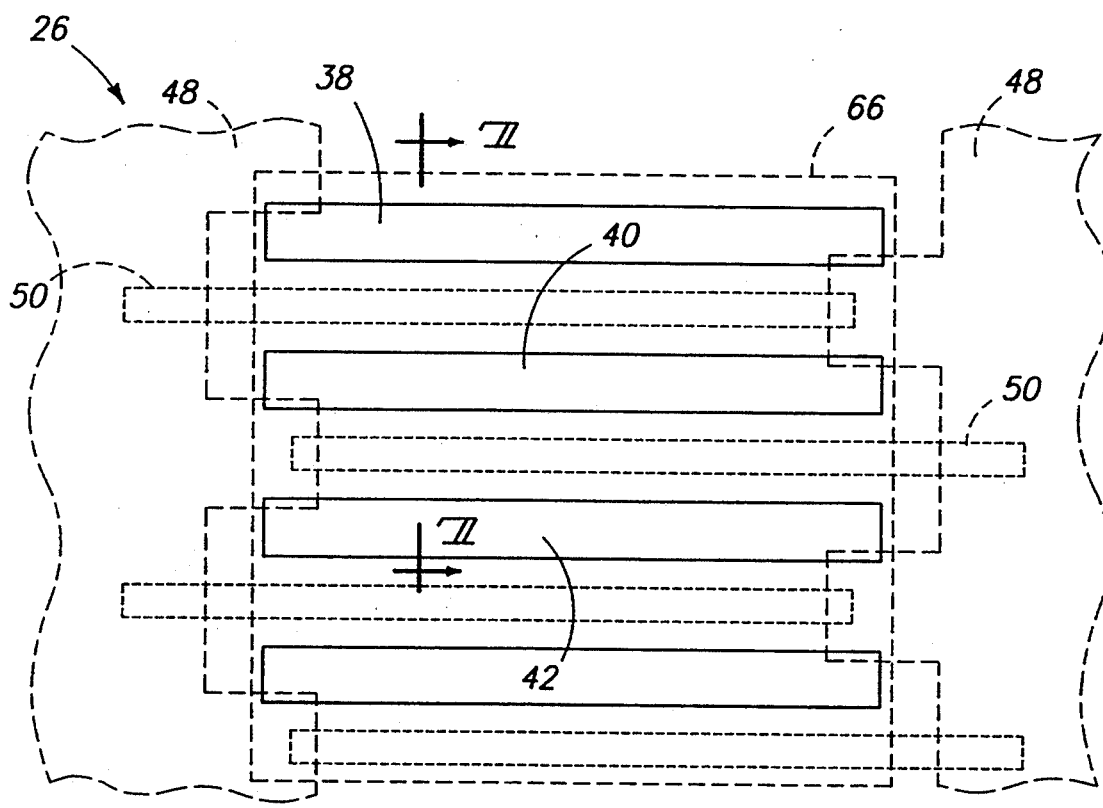
FIG. 8 is a top view of the FIG. 4 wafer fragment corresponding in processing sequence to that shown by FIG. 7. The FIGS. 4–7 views correspond in position to line 7—7 in FIG. 8.

FIG. 8 is a diagrammatic top view of the wafer fragment at the processing step depicted by FIG. 7. For purposes of the continuing discussion, the SONOS memory transistors are provided within a SONOS memory array area 66 in which the non-volatile, single-gate SONOS memory cell transistors reside. Field oxide regions 48 (previously provided) are oriented such that each trench end and their associated diffusion regions extend into a substrate area that is capped with field oxide for electrical isolation purposes. An oxidation and subsequent anneal could also be conducted at this point in the process to form a thin isolation oxide layer atop exposed areas of silicon material.

Figure 9:
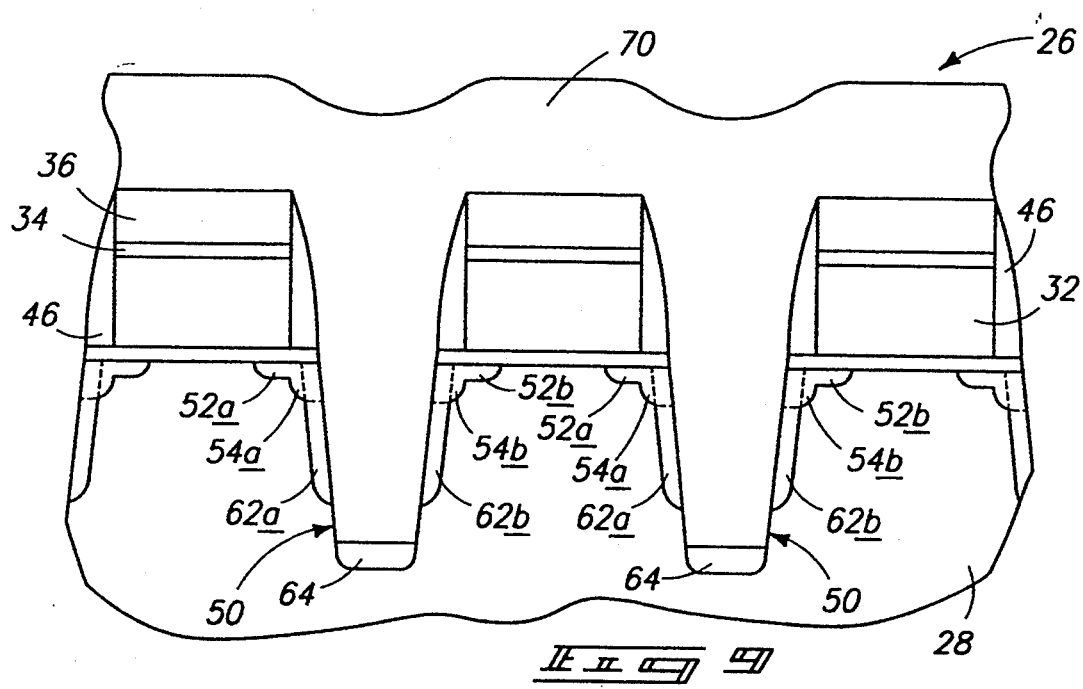
FIG. 9 is a diagrammatic sectional view of the FIG. 4 wafer taken at a processing step subsequent to that shown by FIG. 8, and positionally corresponds to line 7—7 of FIG. 8.

Referring to FIG. 9, trenches 50 are filled with an effectively electrically insulating material 70, such as $SiO_2$, after the angled doping and 0° doping. Any of numerous deposition methods could be utilized, such as spin-on-glass, bubbling ozone/oxygen through TEOS, or other oxide or insulating material deposition. Material 70 will provide lateral electrical insulation/isolation between regions 62a and 62b in trenches 50.

Figure 10:
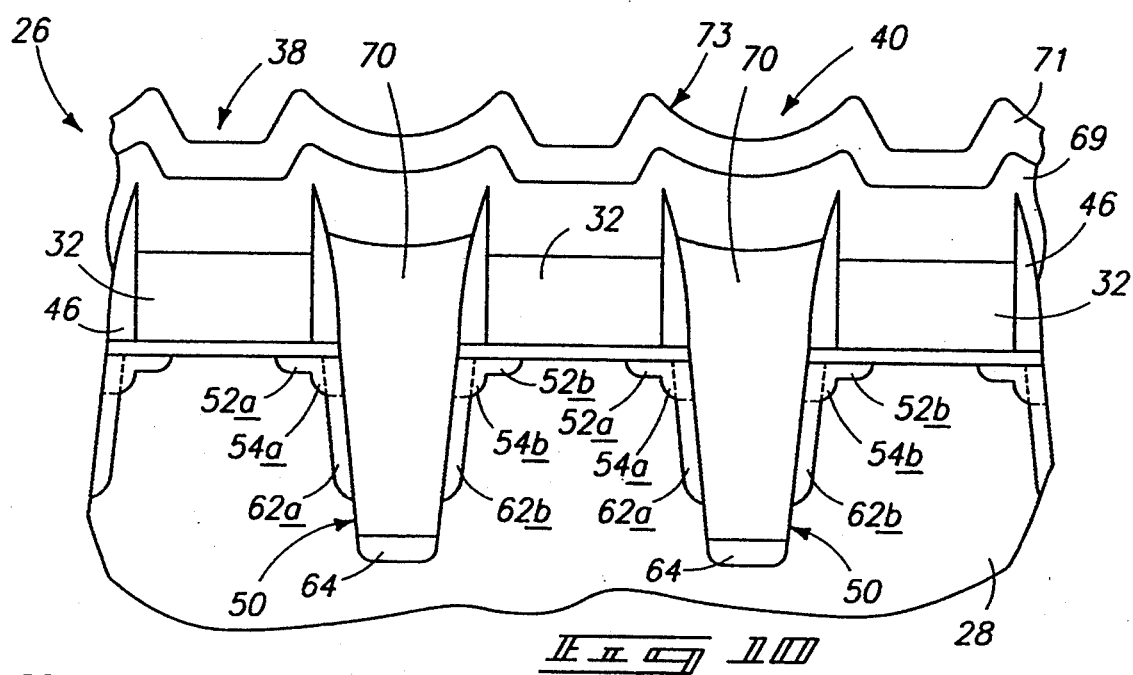
FIG. 10 is a diagrammatic sectional view of the FIG. 4 wafer taken at a processing step subsequent to that shown by FIG. 9, and positionally corresponds to line 7—7 of FIG. 8.
Figure 11:
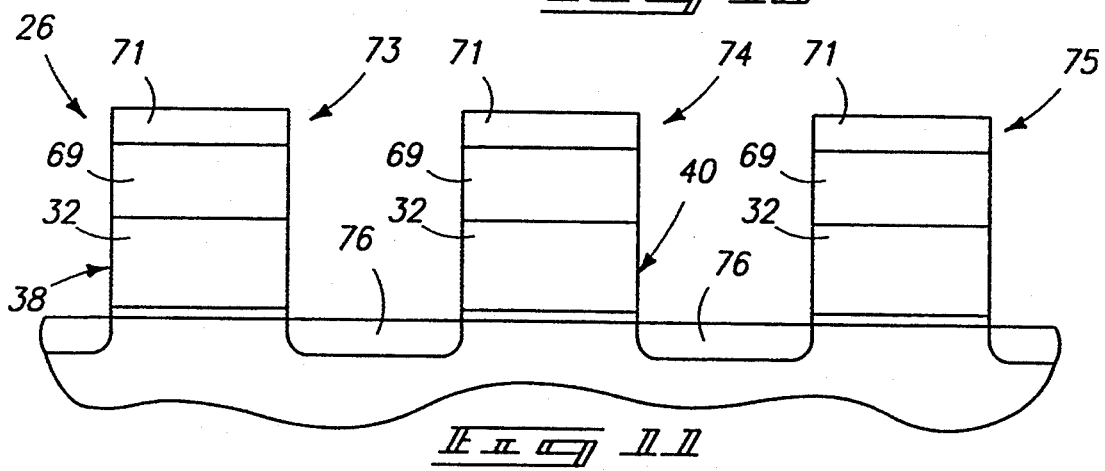
FIG. 11 is a diagrammatic sectional view of the FIG. 4 wafer taken at a processing step subsequent to that shown by FIG. 9, and positionally corresponds to line 11—11 of FIG. 12.

Referring to FIG. 10, layer 70 is etched back, followed by nitride layer 36 being wet or dry stripped from the wafer, followed by a subsequent wet-stripping of thin oxide layer 34. The desired effect is to outwardly expose polysilicon regions 32 of gates 38 and 40. Thereafter, an electrically conductive material layer 69 and capping $WSi_x$ layer 71 are provided outwardly of and in electrical connection with the polysilicon material of adjacent SONOS gate pairs 38 and 40. These layers 72 and 40 are then patterned to form a series of word lines 73, 74, and 75 (FIGS. 10, 11, and 12), with word line 73 by way of example constituting a common connecting line between adjacent pair of SONOS gates 38 and 40. This patterning and etching is also conducted to cut-out the polysilicon from layer 32 which would be in between word lines 73, 74 and 75. This effectively squares-off SONOS gates 38 and 40 beneath the word lines (FIGS. 11 and 12). An isolation doping with a conductivity enhancing impurity of the second conductivity type is then conducted into bulk substrate 28 to produce regions 76 (FIG. 11) into the bulk substrate where polysilicon layer 32 has been removed.

At this point in the preferred process, a series of contact openings 78 are provided to the respective separated source/drain diffusion regions 62. Contact openings 78 are typically and most preferably provided as shown at locations peripheral to array area 66. Thereafter, an electrically conductive material is deposited to fill contact openings 78, and then is subsequently patterned to form separate bit lines 80a, 80b (FIG. 13) which separately engage the respective contacts (78a, 78b) of transistor gate pairs 38 and 40.

Figures 14, 15:
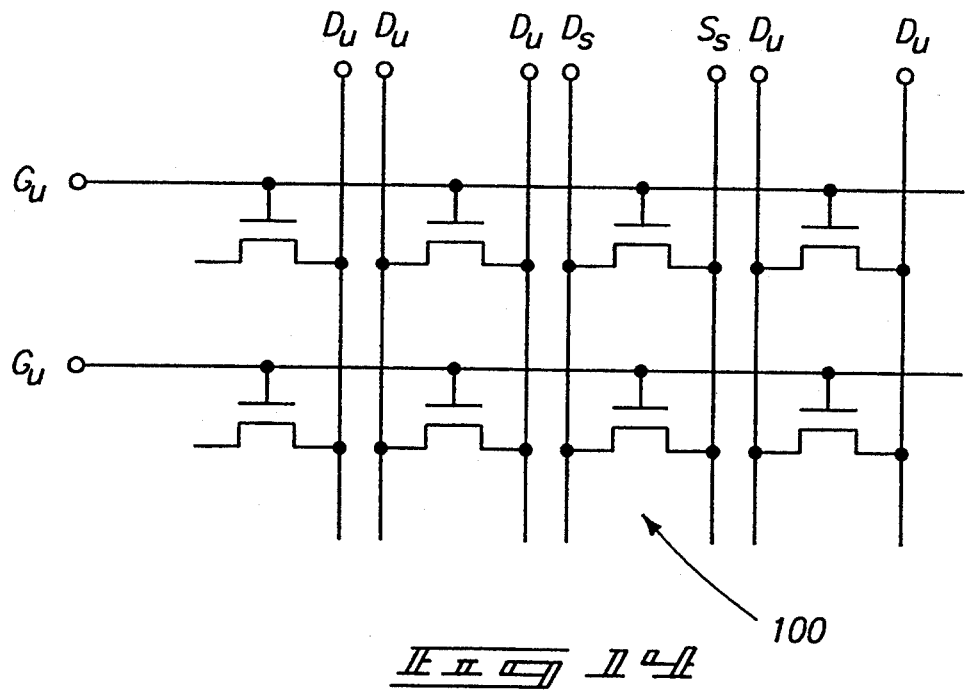
FIG. 14 is a schematic view of a virtual ground SONOS memory array in accordance with the invention.
FIG. 15 is a table illustrating example voltages for given functions of various leads of a selected transistor memory cell of FIG. 14.

FIG. 14 schematically represents a finished virtual ground SONOS array of the invention, and a selected cell (transistor) 100. FIG. 15 illustrates example voltages of the illustrated lines for two respective conditions "A" and "B" based upon the function being performed relative to selected cell 100. The voltages are merely examples, and could of course be downwardly or upwardly scaled in accordance with SONOS programming. The "D", "S" and "G" refer to drain, source and gate, respectively. The subscripts "s" and "u" refer to selected and unselected, respectively. The $V_{b/w}$ refers to the bulk substrate or well voltage. The "oc" refers to open circuit.

The above-described invention enables greater density of SONOS memory cells without requiring separate select or control gates for each memory cell.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. An array of SONOS memory cells; the array including non-volatile, single gate SONOS memory cell transistors having electrically isolated adjacent source/drain regions; the array comprising:

a pair of spaced, adjacent SONOS gates atop a silicon substrate within an array area;

a trench between the gates, the trench having opposing downwardly elongated sidewalls and a base, the sidewalls being doped with a conductivity enhancing impurity of a first conductivity type to define separated source/drain diffusion regions in between and adjacent the respective gates of the pair, the trench being filled with an effectively electrically insulating material;

a word line commonly interconnecting the adjacent SONOS gates of the pair;

separate bit lines separately electrically engaging the separated diffusion regions of the pair;

and further comprising LDD regions for each of the adjacent gates, the LDD regions being angled from the source/drain diffusion regions; and a source/drain interconnecting region between each of the separated source/drain diffusion regions and its respective gate, the source/drain interconnecting regions being angled from the source/drain diffusion regions.

2. An array of SONOS memory cells; the array including non-volatile, single gate SONOS memory cell transistors having electrically isolated adjacent source/drain regions; the array comprising:

a pair of spaced, adjacent SONOS gates atop a silicon substrate within an array area;

a trench between the gates, the trench having opposing downwardly elongated sidewalls and a base, the sidewalls being doped with a conductivity enhancing impurity of a first conductivity type to define separated source/drain diffusion regions in between and adjacent the respective gates of the pair, the trench being filled with an effectively electrically insulating material;

a word line commonly interconnecting the adjacent SONOS gates of the pair;

separate bit lines separately electrically engaging the separated diffusion regions of the pair;

and further comprising LDD regions for each of the adjacent gates, the LDD regions being angled from the source/drain diffusion regions;

a source/drain interconnecting region between each of the separated source/drain diffusion regions and its respective gate, the source/drain interconnecting regions being angled from the source/drain diffusion regions; and an isolation region at the trench base between the source/drain diffusion regions, the isolation region comprising a conductivity enhancing impurity of the second type.

3. An array of SONOS memory cells; the array including non-volatile, single gate SONOS memory cell transistors having electrically isolated adjacent source/drain regions; the array comprising:

a pair of spaced, adjacent SONOS gates atop a silicon substrate within an array area;

a trench between the gates, the trench having opposing downwardly elongated sidewalls and a base, the sidewalls being doped with a conductivity enhancing impurity of a first conductivity type to define separated source/drain diffusion regions in between and adjacent the respective gates of the pair, the trench being filled with an effectively electrically insulating material;

a word line commonly interconnecting the adjacent SONOS gates of the pair;

separate bit lines separately electrically engaging the separated diffusion regions of the pair;

wherein the separated source/drain diffusion regions are each downwardly elongated; and further comprising:

LDD regions for each of the adjacent gates, the LDD regions being angled from the downwardly elongated source/drain diffusion regions; and a source/drain interconnecting region between each of the separated source/drain diffusion regions and its respective gate, the source/drain interconnecting regions being angled from the source/drain diffusion regions.

4. An array of SONOS memory cells; the array including non-volatile, single gate SONOS memory cell transistors having electrically isolated adjacent source/drain regions; the array comprising:

a pair of spaced, adjacent SONOS gates atop a silicon substrate within an array area;

a trench between the gates, the trench having opposing downwardly elongated sidewalls and a base, the sidewalls being doped with a conductivity enhancing impurity of a first conductivity type to define separated source/drain diffusion regions in between and adjacent the respective gates of the pair, the trench being filled with an effectively electrically insulating material;

a word line commonly interconnecting the adjacent SONOS gates of the pair;

separate bit lines separately electrically engaging the separated diffusion regions of the pair;

wherein the separated source/drain diffusion regions are each downwardly elongated; and further comprising:

LDD regions for each of the adjacent gates, the LDD regions being angled from the downwardly elongated source/drain diffusion regions;

a source/drain interconnecting region between each of the separated source/drain diffusion regions and its respective gate, the source/drain interconnecting regions being angled from the source/drain diffusion regions; and an isolation region at the trench base between the source/drain diffusion regions, the isolation region comprising a conductivity enhancing impurity of the second type.

5. An array of SONOS memory cells; the array including non-volatile, single gate SONOS memory cell transistors having electrically isolated adjacent source/drain regions; the array comprising:

a pair of spaced, adjacent SONOS gates atop a silicon substrate within an array area;

a trench between the gates, the trench having opposing downwardly elongated sidewalls and a base, the sidewalls being doped with a conductivity enhancing impurity of a first conductivity type to define downwardly elongated and separated source/drain diffusion regions in between and adjacent the respective gates of the pair, the trench being filled with an effectively electrically insulating material;

LDD regions for each of the adjacent gates, the LDD regions being angled from the downwardly elongated source/drain diffusion regions;

a source/drain interconnecting region between each of the separated source/drain diffusion regions and its respective gate, the source/drain interconnecting regions being angled from the source/drain diffusion regions;

an isolation region at the trench base between the source/drain diffusion regions, the isolation region comprising a conductivity enhancing impurity of the second type;

a word line commonly interconnecting the adjacent SONOS gates of the pair; and separate bit lines separately electrically engaging the separated diffusion regions of the pair at locations peripheral of the array area.

* * * * *